(12) United States Patent
Pitkethly et al.

(10) Patent No.: US 7,495,466 B1
(45) Date of Patent: Feb. 24, 2009

(54) TRIPLE LATCH FLIP FLOP SYSTEM AND METHOD

(75) Inventors: Scott Pitkethly, Redwood City, CA (US); Robert P. Masleid, Monte Sereno, CA (US)

(73) Assignee: Transmeta Corporation, Santa Clara, CA (US)

( * ) Notice: Subject to any disclaimer, the term of this patent is extended or adjusted under 35 U.S.C. 154(b) by 5 days.

(21) Appl. No.: 11/480,107

(22) Filed: Jun. 30, 2006

(51) Int. Cl.
*H03K 17/16* (2006.01)
*H03K 19/003* (2006.01)

(52) U.S. Cl. .............................. 326/27; 326/26; 326/82
(58) Field of Classification Search ............. 326/82–83, 326/86, 93, 95, 98, 26–27; 327/208, 210, 327/215–218, 112
See application file for complete search history.

(56) References Cited

U.S. PATENT DOCUMENTS

| | | | |
|---|---|---|---|
| 3,991,380 A | 11/1976 | Pryor | |
| 4,739,252 A | 4/1988 | Malaviya et al. | |
| 5,128,560 A | 7/1992 | Chern et al. | |
| 5,264,738 A | 11/1993 | Veendrick et al. | |
| 5,297,086 A | 3/1994 | Nasu et al. | |
| 5,410,278 A | 4/1995 | Itoh et al. | |
| 5,453,708 A | 9/1995 | Gupta et al. | |
| 5,467,038 A | 11/1995 | Motley et al. | |
| 5,525,916 A | 6/1996 | Gu et al. | |
| 5,568,103 A | 10/1996 | Nakashima et al. | |
| 5,594,360 A | 1/1997 | Wojciechowski et al. | |
| 5,610,548 A | 3/1997 | Masleid | |
| 5,677,650 A | 10/1997 | Kwasniewski et al. | |
| 5,680,359 A | 10/1997 | Jeong et al. | |
| 5,764,110 A | 6/1998 | Ishibashi et al. | |
| 5,796,313 A | 8/1998 | Eitan et al. | |
| 5,811,983 A | 9/1998 | Lundberg et al. | |
| 5,880,608 A | 3/1999 | Mehta et al. | |
| 5,963,043 A | 10/1999 | Nassif | |
| 5,977,763 A | 11/1999 | Loughmiller et al. | |
| 5,982,211 A | 11/1999 | Ko et al. | |
| 6,011,403 A | 1/2000 | Gillett et al. | |
| 6,025,738 A | 2/2000 | Masleid | |
| 6,028,490 A | 2/2000 | Komatsu et al. | |
| 6,031,403 A | 2/2000 | Gerbach et al. | |
| 6,087,886 A | 7/2000 | Ko et al. | |
| 6,127,872 A | 10/2000 | Kumata et al. | |

(Continued)

FOREIGN PATENT DOCUMENTS

EP          1398639          3/2004

OTHER PUBLICATIONS

Yuan et al. "New domino logic precharged by clock and data" Electronic Letters- vol. 29, No. 25, pp. 2188-2189. Published Dec. 9, 1993.

(Continued)

*Primary Examiner*—Anh Q Tran

(57) ABSTRACT

A triple latch flip flop system and method are disclosed. In one embodiment, triple latch flip-flop system includes a pull up latch, a pull down latch, a primary latch and an output. The pull up latch drives a pull up node. The pull down latch driving a pull down node. The primary latch records state of the triple latch flip-flop system. The output for outputting a logic value based upon outputs of the pull up latch, pull down latch and the primary latch.

15 Claims, 10 Drawing Sheets

U.S. PATENT DOCUMENTS

| | | | |
|---|---|---|---|
| 6,133,759 A | 10/2000 | Beck et al. | |
| 6,154,045 A | 11/2000 | Ye et al. | |
| 6,154,099 A | 11/2000 | Suzuki et al. | |
| 6,154,100 A | 11/2000 | Okamoto et al. | |
| 6,172,943 B1 | 1/2001 | Yuzuki et al. | |
| 6,188,260 B1 | 2/2001 | Stotz et al. | |
| 6,229,747 B1 | 5/2001 | Cho et al. | |
| 6,242,936 B1 | 6/2001 | Ho et al. | |
| 6,242,937 B1 | 6/2001 | Lee et al. | |
| 6,281,706 B1 | 8/2001 | Wert et al. | |
| 6,407,571 B1 | 6/2002 | Furuya et al. | |
| 6,426,641 B1 | 7/2002 | Koch et al. | |
| 6,455,901 B2 | 9/2002 | Kameyama et al. | |
| 6,466,063 B2 | 10/2002 | Chen | |
| 6,476,632 B1 | 11/2002 | La Rosa et al. | |
| 6,489,796 B2 | 12/2002 | Tomishima | |
| 6,535,014 B2 | 3/2003 | Chetlur et al. | |
| 6,538,471 B1 | 3/2003 | Stan et al. | |
| 6,538,522 B1 | 3/2003 | Aipperspash et al. | |
| 6,545,519 B1 | 4/2003 | Carballo | |
| 6,570,407 B1 | 5/2003 | Sugisawa et al. | |
| 6,577,157 B1 | 6/2003 | Cheung et al. | |
| 6,577,176 B1 * | 6/2003 | Masleid et al. | 327/199 |
| 6,621,318 B1 | 9/2003 | Burr | |
| 6,657,504 B1 | 12/2003 | Deal et al. | |
| 6,664,807 B1 | 12/2003 | Crotty et al. | |
| 6,690,242 B2 | 2/2004 | Fang et al. | |
| 6,697,929 B1 | 2/2004 | Cherkauer et al. | |
| 6,724,214 B2 | 4/2004 | Manna et al. | |
| 6,731,140 B2 | 5/2004 | Masleid et al. | |
| 6,731,179 B2 | 5/2004 | Abadeer et al. | |
| 6,759,863 B2 | 7/2004 | Moore et al. | |
| 6,762,966 B1 | 7/2004 | LaRosa et al. | |
| 6,774,734 B2 | 8/2004 | Christensen et al. | |
| 6,798,230 B1 | 9/2004 | Taylor et al. | |
| 6,815,971 B2 | 11/2004 | Wang et al. | |
| 6,815,977 B2 | 11/2004 | Sabbavarapu et al. | |
| 6,831,494 B1 | 12/2004 | Fu et al. | |
| 6,882,172 B1 | 4/2005 | Suzuki et al. | |
| 6,885,210 B1 | 4/2005 | Suzuki | |
| 6,903,564 B1 | 6/2005 | Suzuki | |
| 6,956,405 B2 | 10/2005 | Lundberg | |
| 7,053,680 B2 | 5/2006 | Masleid et al. | |
| 7,076,682 B2 | 7/2006 | Jacobson | |
| 7,119,580 B2 | 10/2006 | Masleid et al. | |
| 7,256,634 B2 * | 8/2007 | Masleid | 327/218 |
| 7,304,503 B2 | 12/2007 | Masleid et al. | |
| 7,310,008 B1 | 12/2007 | Masleid | |
| 7,330,054 B1 | 2/2008 | Masleid | |
| 7,336,103 B1 | 2/2008 | Masleid et al. | |
| 7,414,485 B1 | 8/2008 | Masleid | |
| 2001/0028278 A1 | 10/2001 | Ooishi | |
| 2001/0052623 A1 | 12/2001 | Kameyama | |
| 2002/0039347 A1 | 4/2002 | Matsugatani et al. | |
| 2002/0087930 A1 | 7/2002 | Kanba | |
| 2002/0178415 A1 | 11/2002 | Saraf | |
| 2003/0189465 A1 | 10/2003 | Abadeer et al. | |
| 2004/0032290 A1 | 2/2004 | Lundberg | |
| 2004/0104731 A1 | 6/2004 | Vollertsen | |
| 2004/0119501 A1 | 6/2004 | Sabbavarapu et al. | |
| 2004/0119503 A1 | 6/2004 | Jamshidi et al. | |
| 2004/0148111 A1 | 7/2004 | Gauthier et al. | |
| 2004/0257115 A1 | 12/2004 | Bertram et al. | |
| 2005/0184720 A1 | 8/2005 | Bernstein et al. | |
| 2005/0195642 A1 | 9/2005 | Schmitt | |
| 2005/0206432 A1 | 9/2005 | Tobita | |
| 2005/0212547 A1 | 9/2005 | Suzuki | |
| 2005/0248368 A1 | 11/2005 | Bertram et al. | |
| 2006/0220678 A1 | 10/2006 | Rozas et al. | |

OTHER PUBLICATIONS

Chen, G, et al., "Dynamic NBTI of a p-MOS Transistors and its Impact on MOSFET Scaling", IEEE Electron Device Letters, 2002.

Oner, et al. "A Compact Monitoring Circuit for Real-Time On-Chip Diagnosis of Hot-Carrier Induced Degragation", Microelectronic test structures, Proceedings, IEEE International Conference in Monterey, CA Mar. 17, 1997-Mar. 20, 1997. pp. 72-76.

Peters, Laura, "NBTI: A Growing Threat to Device Reliability", Semiconductor International, Mar. 1, 2004, http//www.reed-electronics.com/semiconductor/article/CA386329?Industryid=3033.

Reddy, V. et al., "Impact of Negative Bias Temperature Instability on Digital Circuit Reliability", 2002 IEEE International Reliability Physics Symposium Proceeding, Dallas, TX, Apr. 7, 2002- Apr. 11, 2002.

* cited by examiner

300

310
PRECHARGING A TRIPLE LATCH FLIP FLOP SYSTEM.

320
EVALUATING DATA IN SAID TRIPLE LATCH FLIP FLOG SYSTEM.

330
ENTERING A DATA BLOCKING PHASE IN SAID TRIPLE LATCH FLIP FLOP SYSTEM.

340
RETURNING SAID TRIPLE LATCH FLIP FLOP SYSTEM TO A PRECHARGE STATE.

Static OAI　　　　　　　　Dynamic OAI

TRIPLE LATCH FLIP FLOP SYSTEM AND METHOD

FIELD OF THE INVENTION

This invention relates to the field of electronic circuits. In particular, the present invention relates to triple latch flip flop systems and methods.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems facilitate increased productivity and cost reductions in analyzing and communicating data, ideas and trends in most areas of business, science, education and entertainment. A number of components such as latches often utilized to facilitate realization of many of these advantageous results. Latches are typically used to facilitate orderly data flow in electronic circuits. However, using traditional flip flop latches often involve tradeoffs that can amount to significant impacts given the prolific use of numerous latches in many applications.

While traditional flip flop latches may provide flow coordination, there are a number of issues that often arise in conventional flip flop latch systems. For example, traditional flip flop latches often involve timing penalties that tend to become even more burdensome as the operating frequencies of various systems increase. Traditional flip flop latches also often involve racing issues, Vmin limitations issues, and power consumption issues. For example, glitching input data can result in unnecessary active power consumption during clock "low" transitions.

SUMMARY

A triple latch flip flop system and method are disclosed. In one embodiment, a triple latch flip-flop system includes a pull up latch, a pull down latch, a primary latch and an output. The pull up latch drives a pull up node. The pull down latch drives a pull down node. The primary latch records the state of the triple latch flip-flop system. The output node outputs a logic value based upon outputs of the pull up latch, pull down latch and the primary latch.

BRIEF DESCRIPTION OF THE DRAWINGS

FIG. 3 is a flow chart of an exemplary triple latch flip-flop method in accordance with one embodiment of the present invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

In one embodiment a triple latch flip flop is an edge-triggered state-element, logically identical to a traditional master-slave flip-flop approach, but with a new fundamental structure that facilitates improvements in speed and electrical robustness. A triple latch flip flop holds an output state during pre-charge phases and briefly drives an output state based upon input data during clock trigger phases, after which the triple latch flip flop "returns" to a pre-charge state and holding a "new" output state. In one exemplary implementation, a triple latch flip flop system can avoid or "sidestep" many traditional master to slave race concerns, Vmin limitations, and data-glitch power consumption.

Figure 1:
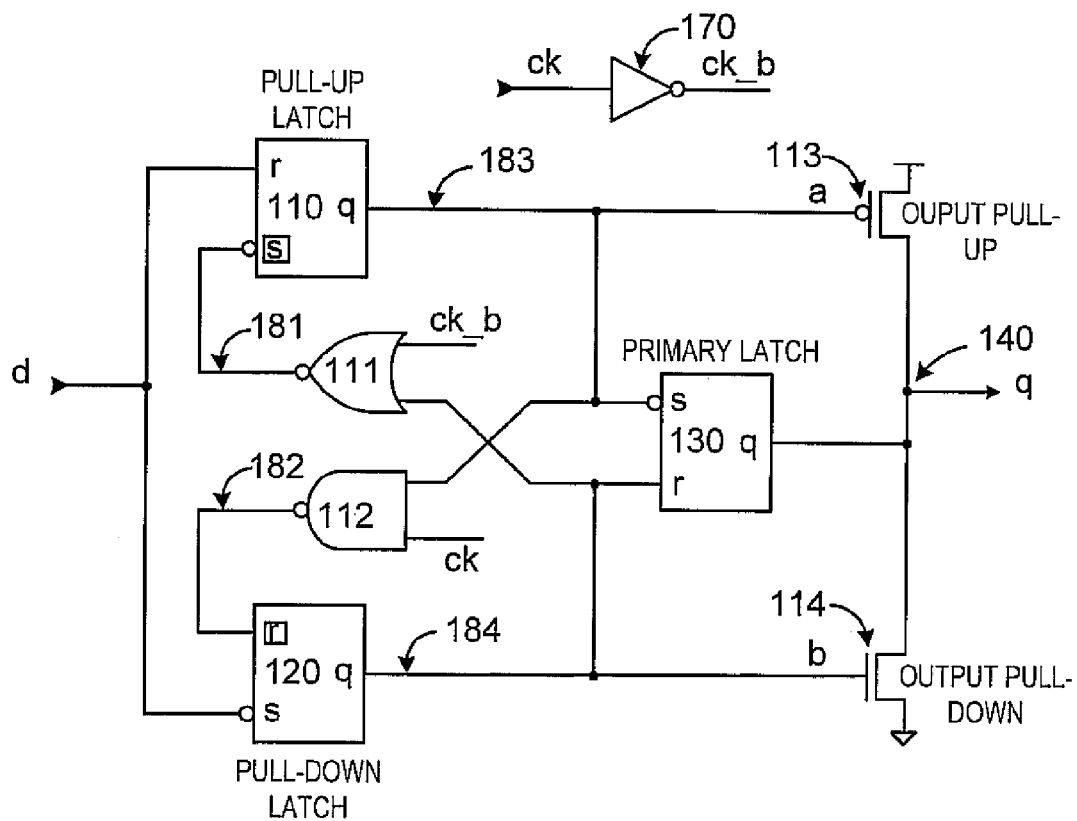
FIG. 1 is a block diagram high level schematic illustration of a triple latch flip flop system in accordance with one embodiment of the present invention.

FIG. 1 is a block diagram high level schematic illustration of triple latch flip flop system 100 in accordance with one embodiment of the present invention. Triple latch system 100 includes pull up latch 110, pull down latch 120, primary latch 130, pull up override component 111, pull down override component 112, pull up node 113, pull down node 114 and output node 140. Primary latch 130 is coupled to pull up latch 110, pull down latch 120, primary latch 130, pull up override component 111, pull down override component 112, pull up node 113, pull down node 114, and output node 140. Pull up latch 110 is coupled to output pull up node 113 which in turn is coupled to output node 140. Pull down latch 120 is coupled to pull down node 114 which in turn is coupled to output node 140.

The components of triple latch flip flop system 100 cooperatively operate to perform latching functions. Pull up latch 110 drives pull up node 113. Pull up node 113 selectively pulls up output node 140. In one embodiment, pull up node includes a transistor coupled to a pull up voltage and controlled by an output of pull up latch 110. Pull down latch 120 drives pull down node 114. Pull down node 114 selectively pulls down output node 140. In one embodiment, pull down node includes a transistor coupled to a pull down voltage and controlled by an output of pull down latch 120. Primary latch 130 records a state of said triple latch flip-flop system. Output node 140 outputs a logic value based upon outputs of pull up latch 110, pull down latch 120 and primary latch 130.

Figure 2A:
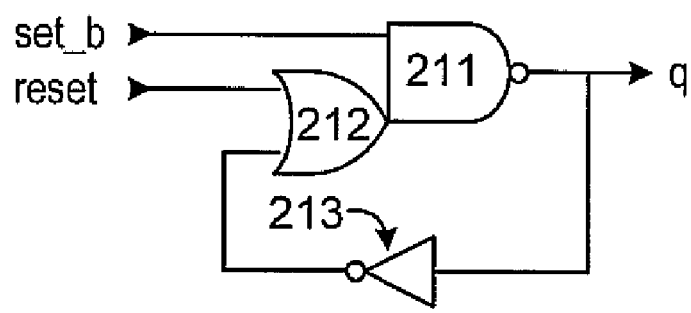
FIG. 2A is a block diagram high level schematic illustration of a priority on set static latch in accordance with one embodiment of the present invention.
Figure 2B:
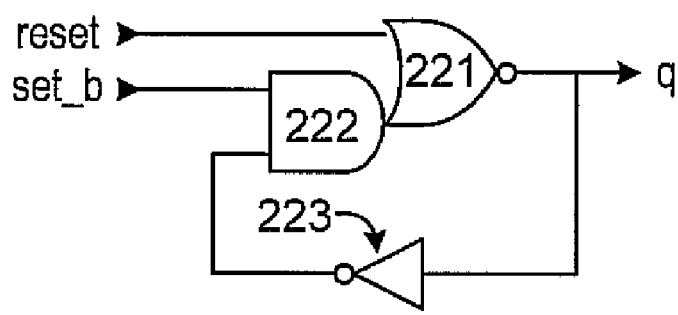
FIG. 2B is a block diagram high level schematic illustration of a priority on reset static latch in accordance with one embodiment of the present invention.

It is appreciated that the latches of the present invention can be implemented in accordance with a variety of schemes or techniques. For example, the latches (e.g., pull up latches, pull down latches, primary latches, etc.) can be constructed out of static logic gates or dynamic gates. FIGS. 2A and 2B are block diagrams of static implementations of latches in accordance with one embodiment of the present invention. FIG. 2A illustrates exemplary Set/Reset (SR) static latch 210 with priority on set_b. Set/Reset static latch 210 includes NAND gate 211 coupled to OR gate 212 and feedback Inverter 213. The state or truth table for state static latch 210 is summarized as follows:

| Set-b | reset | function |
|---|---|---|
| 0 | 0 | Set |
| 0 | 1 | Set |
| 1 | 0 | Retain State |
| 1 | 1 | reset |

FIG. 2B illustrates exemplary Set/Reset (SR) static latch 220 with priority on reset. Set/Reset static latch 220 includes NOR gate 212 coupled to AND gate 222 and feedback Inverter 223. The state or truth table for state static latch 220 is summarized as follows:

| Set-b | reset | function |
|---|---|---|
| 0 | 0 | Set |
| 0 | 1 | Reset |
| 1 | 0 | Retain State |
| 1 | 1 | reset |

Each latch sets on a low set signal "s" and resets on a high reset signal "r".

Referring back to FIG. 1, boxed inputs of the pull up latch 110 and pull down latch of 120 take priority over unboxed. For example, in pull up latch 110 the set "s" input takes priority over the reset "r" input. Thus, a low set "s" input in the pull up latch 110 drives the output "q" high, regardless of the state of reset input "r". Likewise, in pull down latch 120 a high reset signal "r" drives the output "q" low regardless of the state of set signal "s". In the case of primary latch 130, either input (set "s" or reset "r") can receive priority without affecting the operation of the circuit, so no box is drawn. In one exemplary implementation, either latch of FIG. 2A or 2B can be used for the primary latch.

FIG. 3 is a flow chart of exemplary triple latch flip-flop method 300 in accordance with one embodiment of the present invention. In one embodiment of triple latch flip flop method 300 the data is sampled in response to a clock trigger and the state of flop is changed to match that data input. The data is free to toggle after a relatively small hold time without having to worry about the triple latch flip flop toggling with data. In one exemplary implementation, a triple latch flip flop is temporarily driven in a clock trigger phase to match input data and a corresponding state is held for the remainder of the clock cycle.

At block 310, a triple latch flip flop system is pre-charged. In one embodiment, the pre-charging includes shutting off output drivers and putting a primary latch into a retention mode. In one exemplary implementation, the pre-charging includes forcing a pull-up latch into a set state and a pull-down latch into a reset state. In a pre-charge phase the output is weakly held until a subsequent dock trigger.

With reference back to FIG. 1, in pre-charge state the clock signal (ck) is initially low and clock bar signal (ck_b) is initially high. The path 181 is low or a logical "0" and the path 182 is high or logical "1". Pull up latch 110 and pull down latch 120 are "forced" into set and reset conditions, respectively. This shuts off the output drivers (e.g., pull up driver 113 and pull down driver 114) and puts the primary latch 130 into retention mode. With the pull up and pull down output drivers off (e.g., 113 and 114), the primary latch weakly drives the output "q". The system remains in this state until a subsequent clock trigger (e.g., a rising clock edge).

Referring back to FIG. 3, data is evaluated in the triple latch flip flop system at block 320. In one embodiment, evaluation includes driving an output node and setting a primary latch. "State holds" on driver latches are released and the latches control pullup and pull down nodes in accordance with data input. In one exemplary implementation, releasing a state hold of a pull-up latch and pull-down latch includes either resetting the pull up latch or setting the pull down latch.

In one embodiment, a rising clock of triple latch flip flop system 100 shown in FIG. 1 triggers data propagation through the system. Path 181 goes high and path 182 goes low. The pull up latch 110 is no longer forced to set, and the pull down latch 120 is no longer forced to reset. Data propagates through one of the driver latches. If data is high, it resets the pull up latch 110 and a low or logical 0 "turns on" pull-up node 113 which pulls up output node 140 to correspond to the high data. This furthermore sets the primary latch 130. If data is low, it sets the pull down latch 120 and a high or logical 1 "turns on" pull-up node 114 which pulls down output node 140 to correspond to the low data. This furthermore resets the primary latch 130.

With reference back to FIG. 1, an evaluation phase corresponding to high or logical 1 data causes path 182 go back to high or a logical 1. When input data is high, path 183 goes low and path 184 remains low. First, pull up latch 110 resets causing input to pull-up node 113 to fall. This in turn, forces the output pull-up node 113 to strongly drive output node "q" high; sets the primary latch 130 and instructs the pull down latch 120 to reset With reference again to FIG. 3, data in the triple latch flip flop enters a blocking phase in block 330. In one embodiment, the blocking phase includes blocking future transitions on the data input. In one exemplary implementation, either a pull up latch is instructed to set or a pull down latch to reset. The data input is free to toggle during the blocking phase without affecting the state of the triple latch flip flop system.

With reference again to FIG. 1, pull down latch 120, now with its (priority) reset input enabled, drives the pull-down node 114 low without regard to activity on the data input. With ck_b still low, and node 184 now low, NOR gate 111 pulls node 181 high, which disables the set input of pull up latch 110. The pull up latch 110, with its set input disabled, lacks the ability to drive the pull-up node 113 back high. If the data input toggles, the pull up latch 110 simply shifts between reset and retention modes. The pull-up node 113 is unaffected and remains on. The triple latch flip flop system 100 remains in this state until the clock falls.

An analogous set of events unfolds when evaluation occurs under low data. Path 181 goes low or a logical 0 and path 182 remains low or a logical 0. When input d is low path 183 is high and path 184 is also high. The triple latch flip flop system 100 remains in this state until the clock falls.

With reference once more to FIG. 3, the triple latch flip flop system is returned to a pre-charge state in block 340. Referring once again to FIG. 1 to illustrate one exemplary implementation, path 181 is low or a logical 0 and path 182 is high or a logical 1. Path 183 goes high or a logical 1. A falling clock signal forces pull up latch 110 to set and pull down latch 120 to reset. This in turn shuts down the pull up driver 113 and pull down driver 114 and also puts the primary latch into retention mode. The output 'q' is weakly driven by the primary latch until the next rising edge of clock.

Clock gating of present invention triple latch flip flop systems and methods can be achieved utilizing a variety of different configurations. In one embodiment, direct gating of the clock is utilized. In one exemplary implementation, a NAND gate is used to create gated clock bar for distribution to the flops. This can be done outside of the triple latch flip flop at the clock driver or can easily be incorporated into the triple latch flip flop itself in one embodiment of the present invention. The enable can furthermore factor into the NAND and NOR gates of the triple latch flip flop. For example, the enable signal can be used as a third input of the NAND gate, and the enable signal complement can be used as a third input of the NOR. In one embodiment, the inverter is incorporated into the triple latch flip flop.

In yet another embodiment, a third option is to factor enable into the complex gates of the driver latches. In an exemplary implementation, when enable is low a pull-up driver latch (e.g., 110) is forced to set and a pull-down driver latch (e.g. 120) is reset. This implementation can give more timing flexibility to the enable.

A good measure of flop speed is the propagation delay from the 'd' input to the 'q' output and is called d-to-q delay. In one embodiment of a triple latch flip flop the d-to-q delay is about a two gate delay. First, the data propagates through the complex gate of a driver latch. In one exemplary implementation, this gate is ratioed to favor the evaluate edge, which speeds d-to-q. The result is a propagation time of about one gate-delay. Second, either the pull-up or pull-down output node turns on to drive the 'q' output. In one embodiment, the output driver nodes (e.g., 113, 114, etc) include transistors that turn on at nearly their threshold voltage. In one exemplary implementation, the opposing output driver is guaranteed to be off, resulting in a propagation time of less than one gate-delay.

Figure 4A:
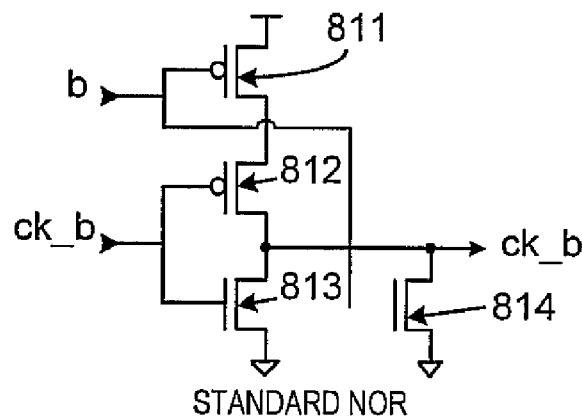
FIG. 4A is an schematic illustration of an exemplary standard NOR clock inversion component in accordance with one embodiment of the present invention.
Figure 4B:
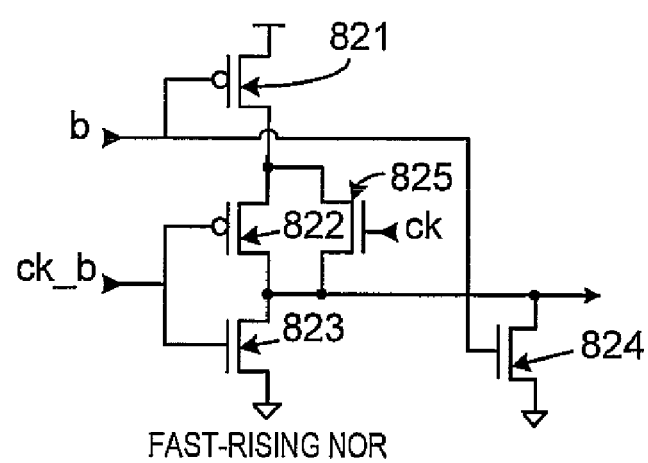
FIG. 4B is a schematic illustration of an exemplary fast rising NOR inversion component with a skew compensating transistor in accordance with one embodiment of the present invention.

In one embodiment, the inversion of clock to create ck_b introduces an inequality in timing because 'ck_b' falls one gate-delay after 'ck' rises. To address this inequality, an additional transistor is added to the NOR gate and can facilitate substantial reduction of the inequality effect. FIG. 4A is a schematic illustration of an exemplary standard NOR clock inversion component 810 in accordance with one embodiment of the present invention. Standard NOR clock inversion component 810 includes transistors 811, 812 813 and 814. FIG. 4B is a schematic illustration of an exemplary fast rising NOR inversion component 820 with a skew compensating transistor in accordance with one embodiment of the present invention. Fast rising NOR inversion component 820 includes transistors 821, 822, 823, 824 and 825.

The above descriptions of the triple latch flip flop assume the clock (ck) precedes inverse clock (ck_b). However, in some implementations the converse is true, in which case the appropriate fix is to create a p-transistor, controlled by ck_b, to be placed in the NAND, parallel to the n-transistor that is controlled by ck.

In one embodiment, transistors of the latches are ratioed to help address race conditions. For example, if both inputs of the NAND gate transition on falling clock a race condition can occur. One rises while the other falls, but the falling input (e.g., the clock input) transitions first. Otherwise the NAND output would pulse low, temporarily releasing the lower latch from reset. Should data be low at this time, the lower latch sets the pull-down node and destroys the state of the primary latch. An analogous race occurs when clock falls after an evaluation on low data. This race is be between the two inputs of the NOR gate. Again, the clock input (this time ck_b) should transition first. In the worst of these two cases (the NOR gate race rising ck_b to falling pull-down node), the race is won by one gate-delay. For, d-to-q reasons the pull up latch and pull down latches are ratioed to speed evaluation and are therefore slow to pre-charge, giving additional margin to the race. Although the race is easily won, attention is paid during construction to guarantee proper operation.

Figure 5:
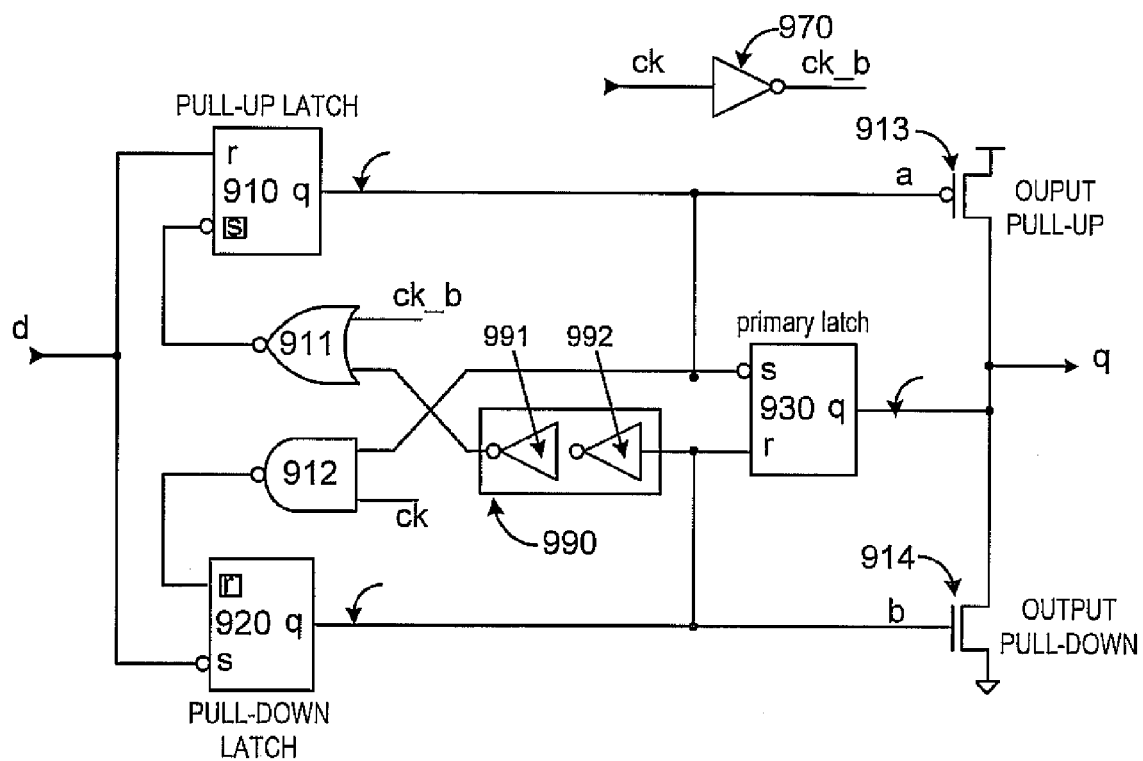
FIG. 5 is an illustration of an exemplary auxiliary race suppression triple latch flip flop system in accordance with one embodiment of the present invention.

The exemplary race on falling clock described earlier, has between one and two gate-delays of margin in one exemplary implementation. Additional margin may be added by adding two inverters on the "offending" feedback node. In one embodiment, this is the pull-down node feeding back into the NOR gate. FIG. 5 is an illustration of an exemplary auxiliary race suppression triple latch flip flop system 900 in accordance with one embodiment of the present invention. Triple latch flip flop system 900 is similar to triple latch flip flop system 100 except triple latch flip flop system 900 includes auxiliary race suppression component 990. For example, Triple latch system 900 includes pull up latch 910, pull down latch 920, primary latch 930, pull up override component 911, pull down override component 912, pull up node 913, pull down node 914 and output 940 which are similar to pull up latch 110, pull down latch 120, primary latch 130, pull up override component 111, pull down override component 112, pull up node 113, pull down node 114 and output 140 of Triple latch flip flop system 100. In one embodiment, auxiliary race suppression component 990 includes inverter 991 and inverter 992. While in numerous situations the additional margin is unnecessary, it is helpful in race suppression situations.

In one embodiment of the present invention, transistors are fabricated to "favor" transitions in state. In one exemplary data retention mode of the present invention, a pull up latch (e.g., 110) holds a logical zero and the pull down latch (e.g. 120) holds a logical one. This condition can be leveraged to improve the noise immunity of the latches. Specifically, the pull up latch benefits from constructing the complex gate so that it pulls down quickly and the feedback inverter so that it pulls up quickly. The pull down latch benefits from constructing the complex gate so that it pulls up quickly and the feedback and the inverter so that it pulls down quickly. This not only improves noise immunity (and therefore Vmin), but it also improves the d-to-q of the triple latch flip flop system. It furthermore gives additional margin to the race (on falling clock) as previously described.

In the primary latch, noise margin enhancement and lower minimum operating voltage are achieved by using multiple inverters in the feedback. Immunity further improves by replicating four transistors of the complex gate to create an isolated second output. Logically, this duplicates the gate. One logical gate is then used to drive the storage node, and the other logic gate is used to drive the "q" output. This isolates the storage node from the potentially noisy "q" output. The enhanced immunity comes at little to no timing penalty. In one exemplary implementation eight transistors (e.g., two transistors for each new inverter and four transistors for the complex gate) are utilized to achieve the enhanced noise immunity.

Figure 6:
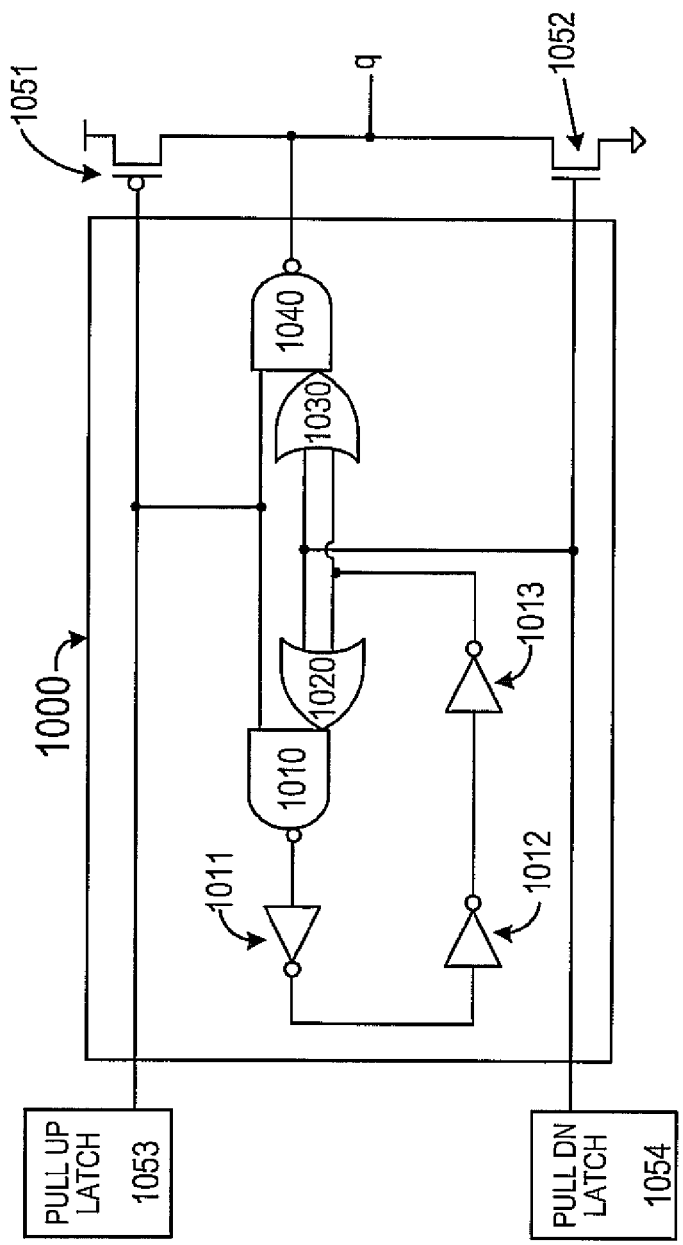
FIG. 6 is a schematic illustration of an exemplary primary latch with enhanced noise immunity in accordance with one embodiment of the present invention.

FIG. 6 is a schematic illustration of a primary latch 1000 with enhanced immunity in accordance with one embodiment of the present invention. Primary latch 1000 includes NAND gate 1010, OR gate 1020, OR gate 1030, NAND gate 1040 and inverters 1011, 1012 and 1013. In one embodiment, NAND gate 1010 and OR gate 1020 form a first complex gate and NAND gate 1040 and OR gate 1030 form a second complex gate. In one exemplary implementation, the complex gates are or-and-invert (OAI) complex gates. In one embodiment, primary latch 1000 is included in a system similar to triple latch flip flop system 100 and is coupled to pull up transistor 1051, pull down resistor 1052, pull up latch 1053 and pull down latch 1054 which are similar to pull up transistor 113, pull down resistor 114, pull up latch 110 and pull down latch 120.

Figure 7A:
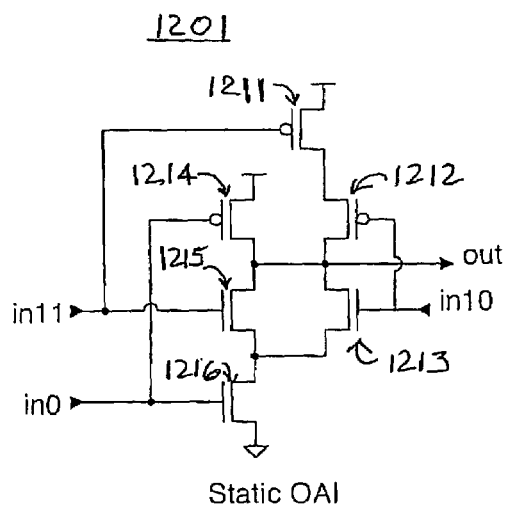
FIG. 7A illustrates exemplary static OAI in accordance with one embodiment of the present invention.
Figure 7B:
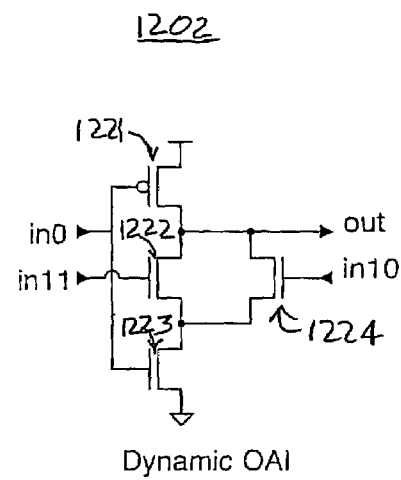
FIG. 7B illustrates exemplary dynamic OAI in accordance with one embodiment of the present invention.

FIG. 7A illustrates an exemplary static OAI 1201 in accordance with one embodiment of the present invention. Static OAI 1201 includes transistors 1211, 1212, 1213, 1214, 1215, and 1216. FIG. 7B illustrates exemplary dynamic OAI 1202 in accordance with one embodiment of the present invention. Dynamic OAI 1202 includes transistors 1221, 1222, 1223 and 1224. An analogous AOI can be constructed for a pull down latch in accordance with the present invention.

If area becomes a priority, the NOR and NAND gates can be absorbed by the pull up latch and pull down latches respectively. In one exemplary static implementation, this reduces the transistor count by two.

Figure 8:
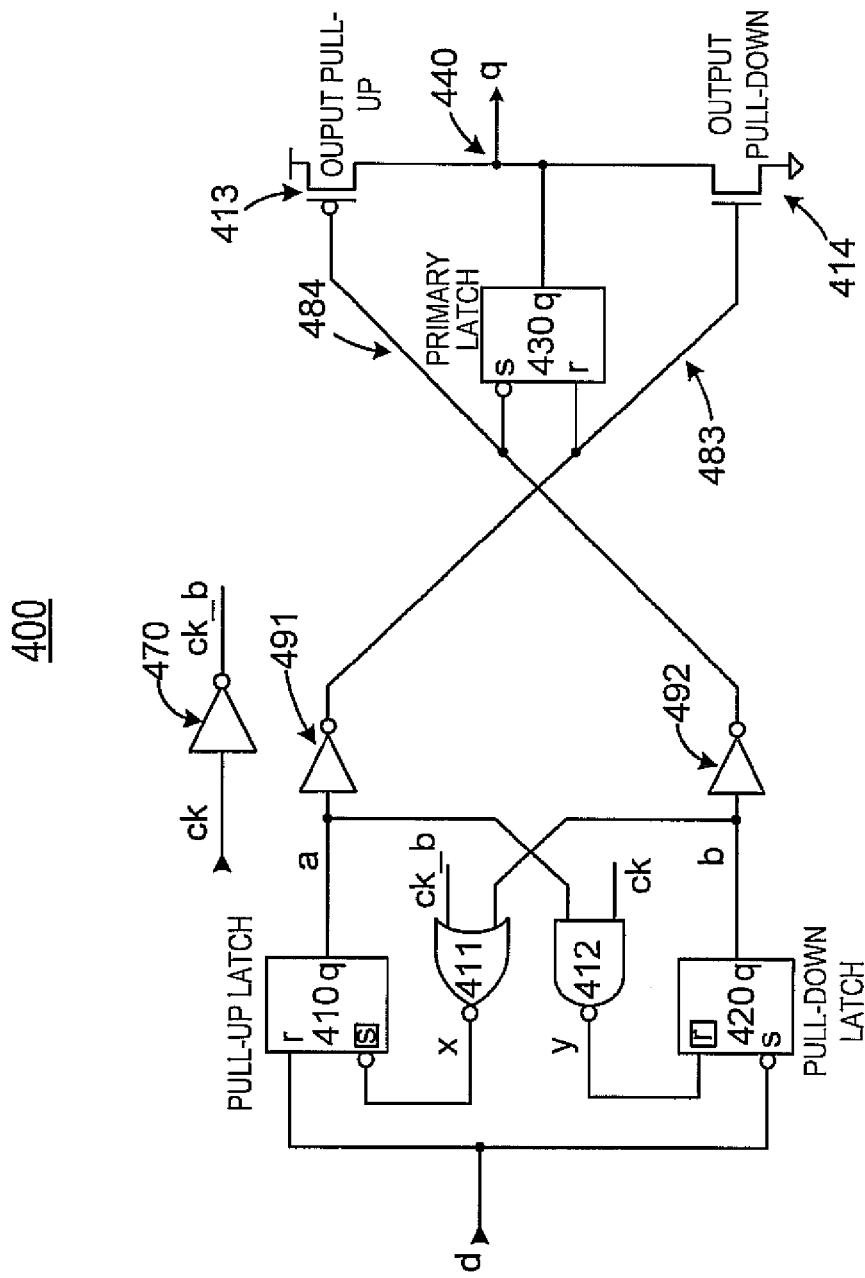
FIG. 8 is a schematic illustration of exemplary static drive enhancement in accordance with one embodiment of the present invention.

In one embodiment, the fundamental structure of a triple latch flip flop system can be leveraged to quickly increase current gain. FIG. 8 is a schematic illustration of exemplary triple latch flip flop system 400 with static enhancement in accordance with of the present invention. In one exemplary implementation, an inverter 491 is added to the input path of a pull up node and an inverter 492 is added to an input path of a pull down node. The inverters are heavily skewed to pull up and pull down, respectively. In one exemplary implementation, the output of a pull up latch is inverted and drives the output pull-down node and the output of a pull down latch is inverted and drives the output pull-up pull up node. Triple latch flip flop system 400 is similar to triple latch flip flop system 100 except triple latch flip flop system 400 includes inverters 491 and 492 and paths 484 and 483 are altered from respective paths 183 and 184. For example, triple latch system 400 includes pull up latch 410, pull down latch 420, primary latch 430, pull up override component 411, pull down override component 412, pull up node 413, pull down node 414 and output 440 which are similar to pull up latch 110, pull down latch 120, primary latch 130, pull up override component 111, pull down override component 112, pull up node 113, pull down node 114 and output 140 of Triple latch flip flop system 100.

In one embodiment, the drive enhancement inverters are the feedback inverters already included in the pull up latch and pull down latch. This drive enhancement requires no additional inverters. Because the inverters are highly skewed, they switch before the input transition hits the 50% mark. In one embodiment, a chain of skewed inverters can exceed a typical factor-of-four current gain. In one exemplary implementation, an enhanced gain of roughly a factor-of-six is realized. It is to be appreciated that triple latch flop system 400 is an inverting flip flop. Additional skewed inverters can be added to create additional gain and/or to create inverting or non-inverting triple latch flop systems.

Figure 9:
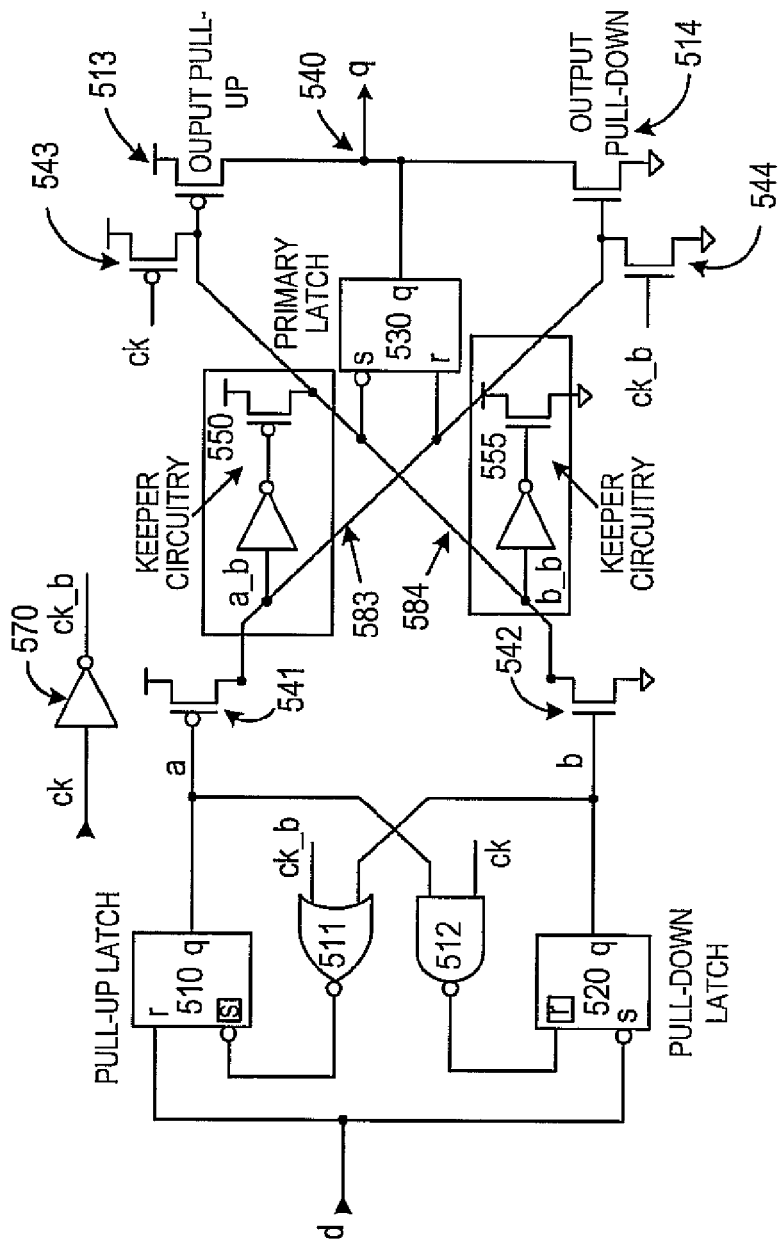
FIG. 9 is a schematic illustration of an exemplary triple latch flip flop system with enhanced drive dynamic inversion in accordance with one embodiment of the present invention.

In one embodiment of the present invention, drive enhancement includes a dynamic inverter on the input path of a pull up node and another inverter on the input path of a pull down node. FIG. 9 is a schematic illustration of an exemplary triple latch flip flop system 500 with enhanced drive dynamic inversion in accordance with one embodiment of the present invention. The outputs of the inverters, 'a_b' and 'b_b' directly pre-charge on low clock. On high clock, either a_b will pull up or b_b will pull down. The other node is held by the corresponding keeper. The dynamic method provides greater current gain than the static version. Triple latch flip flop system 500 is similar to triple latch flip flop system 100 except triple latch flip flop system 500 includes transistors 541, 542, 543 and 544, and keeper circuits 550 and 555 with paths 584 and 583 altered from respective paths 183 and 184. For example, triple latch system 500 includes pull up latch 510, pull down latch 520, primary latch 530, pull up override component 511, pull down override component 512, pull up node 513, pull down node 514 and output 540 which are similar to pull up latch 110, pull down latch 120, primary latch 130, pull up override component 111, pull down override component 112, pull up node 113, pull down node 114 and output 140 of Triple latch flip flop system 100.

It is appreciated that present invention flip flop enhancement features can be utilized to enhance traditional flip flop configurations. For example, present invention improved noise margin approaches, improved race margin approaches, and improved setup constraint approaches can be utilized in traditional flip flop configurations.

Figure 10:
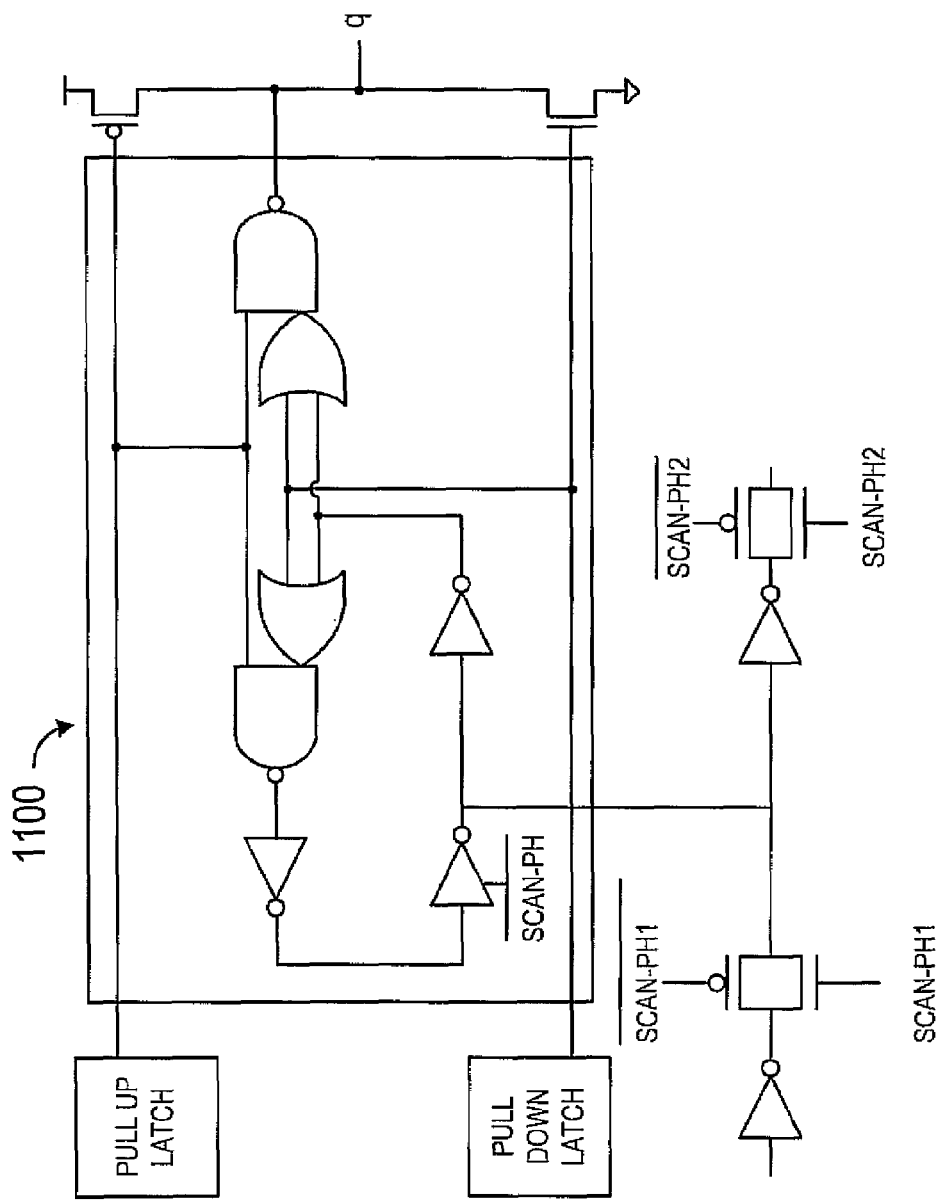
FIG. 10 is a schematic illustration of an exemplary primary latch with enhanced noise immunity and scan functionality in accordance with one embodiment of the present invention.

It is also appreciated that the present invention can be readily implemented with a scan function. In one embodiment, the scan function is added to the primary latch. FIG. 10 is one exemplary implementation of a primary latch system 1100 in which a scan function is added to a primary latch. Primary latch system 1100 is similar to primary latch system 1000 except primary latch system 1100 has a scan function added.

Thus, present invention systems and methods are efficient and conveniently perform latching operations. Present invention systems and methods can facilitate improved latching with reduced time delay, noise interference and enhanced setup constraints.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A triple latch flip-flop system comprising:
a pull up latch for driving a pull up node, pull up latch comprises a priority on set operation;
a pull down latch for driving a pull down node;
a primary latch for recording a state; and
an output derived from the outputs of said pull up latch, pull down latch and said primary latch.

2. A triple latch flip flop system of claim 1 wherein said pull up latch, pull down latch and primary latch comprise static logic gates.

3. A triple latch flip flop system of claim 1 wherein said pull down latch comprises a priority on reset operation.

4. A triple latch flip flop system of claim 1 wherein said pull up latch, pull down latch and primary latch comprise dynamic gates.

5. A triple latch flip flop system of claim 4 wherein said pull down latch comprises a priority on reset operation.

6. A triple latch flip-flop method comprising:
precharging a triple latch flip flop system, wherein said evaluating includes releasing a state hold on a pull-up latch and pull-down latch;
evaluating data through said triple latch flip flop system;
blocking data in said triple latch flip flop system; and
returning said triple latch flip flop system to a pre-charge state.

7. A triple latch flip-flop method of claim 6 wherein said precharging includes shutting off output drivers and putting a primary latch into a retention mode.

8. A triple latch flip-flop method of claim 6 wherein said precharging wherein said precharging includes forcing a pull-up latch into a set state and a pull-down latch into a reset state.

9. A triple latch flip-flop method of claim 6 wherein said precharging weakly drives an output.

10. A triple latch flip-flop method of claim 6 wherein said precharging includes holding a output state until a clock trigger.

11. A triple latch flip-flop method of claim 6 wherein said evaluating includes clocking said triple latch flip flop system.

12. A triple latch flip-flop method of claim 6 wherein said evaluating includes resetting a pull up latch.

13. A triple latch flip-flop method of claim 6 wherein said evaluating includes setting a pull down latch.

14. A triple latch flip-flop method of claim 6 wherein said evaluating comprise resetting a pull up latch and strongly driving an output node;
setting a primary latch; and
instructing a pull down latch to reset.

15. A triple latch flip-flop method of claim 6 further comprising performing race margin correction.

* * * * *